(12) United States Patent
Kim et al.

(10) Patent No.: US 7,888,689 B2
(45) Date of Patent: Feb. 15, 2011

(54) LIGHT EMITTING PACKAGE AND LIGHT EMITTING PACKAGE ARRAY

(75) Inventors: Hyung-kun Kim, Yongin-si (KR); Yu-sik Kim, Yongin-si (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 15 days.

(21) Appl. No.: 11/798,390

(22) Filed: May 14, 2007

(65) Prior Publication Data

US 2007/0267637 A1 Nov. 22, 2007

(30) Foreign Application Priority Data

May 18, 2006 (KR) .................. 10-2006-0044640

(51) Int. Cl.
*H01L 33/00* (2010.01)
(52) U.S. Cl. .............. 257/81; 257/98; 257/99; 257/692; 257/693; 257/E33.001
(58) Field of Classification Search .......... 257/81, 257/98, 99, 693, 82, 84, 88, 692, 100
See application file for complete search history.

(56) References Cited

U.S. PATENT DOCUMENTS

2005/0269589 A1* 12/2005 Wu .......................... 257/99

2006/0157726 A1* 7/2006 Loh et al. ................... 257/100

FOREIGN PATENT DOCUMENTS

KR 10-2004-0083092 * 4/2006

OTHER PUBLICATIONS

Machine Translation of Published Korean Patent Application 10-2004-0083092.*

* cited by examiner

*Primary Examiner*—David Vu
*Assistant Examiner*—Suberr Chi
(74) *Attorney, Agent, or Firm*—Harness, Dickey & Pierce, P.L.C.

(57) ABSTRACT

Example embodiments may include a light emitting device package. The light emitting device package may include a light emitting device, a package body including a cavity having a bottom surface on which the light emitting device is mounted and a side surface for reflecting light emitted from the light emitting device, a first electrode protruding from the package body, and a second electrode coupled with the package body. The first and second electrodes may be designed to couple respectively with the second and first electrodes of another light emitting device package, thereby forming an array of light emitting device packages.

17 Claims, 8 Drawing Sheets
(1 of 8 Drawing Sheet(s) Filed in Color)

LIGHT EMITTING PACKAGE AND LIGHT EMITTING PACKAGE ARRAY

PRIORITY STATEMENT

This application claims the benefit of Korean Patent Application No. 10-2006-0044640, filed on May 18, 2006, in the Korean Intellectual Property Office, the disclosure of which is incorporated herein in its entirety by reference.

BACKGROUND

1. Field

Example embodiments relate to a light emitting device package and an array thereof, for example, to a light emitting device package array that may improve color uniformity and/or a package alignment of a light-emitting device package array.

2. Description of the Related Art

A related art light emitting device package may include a plurality of light emitting devices such as light emitting diodes (LED), a laser diode (LD), and/or a package body on which a light emitting device and electrodes may be mounted. A related-art light-emitting device package array may include a display device that displays letters or graphic images or a display lamp in which a plurality of light emitting device packages are arrayed. A related art second level packaging process may include a process of forming a light emitting device package array by arranging a plurality of electrically-connected light emitting device packages in a space. For example, in a second level packaging process, a plurality of light emitting device packages may be arrayed on a printed circuit board (PCB), and light emitting device packages may be soldered at desired locations through a reflow process.

If the related art light emitting device package array is formed with a light emitting device package in a module type and with the desired number of module type light emitting device packages in a desired shape, a variety of light emitting device package arrays may be formed rather than if the light emitting device package array is formed by integrally fixing the light emitting device packages. If the light emitting device packages are arrayed, the light emitting device packages may be arranged at non-uniform intervals, or the arrangement of the light emitting device packages may vary due to the thermal deformation during the second level packaging process. FIG. 1 illustrates an example where light emitting device packages are misaligned in a related art light emitting device package array. Misalignment of light emitting device packages may cause deterioration of display quality and process yield of a display device in which they are arrayed.

FIG. 2 illustrates an example where color uniformity of light emitting device packages is poor in a related art light emitting device package array. Among arrayed light emitting device packages, those that are low in color quality or have poor light intensity uniformity must be replaced before and after a second level packaging process may be performed.

SUMMARY

Example embodiments may provide a light emitting device package that may simplify a second package process, reduce manufacturing costs, and/or improve uniformity of color and/or light intensity. Example embodiments also may provide a light emitting device package array in which light emitting device packages may be connected to form such an array.

Example embodiments may provide a light emitting device package including a light emitting device; an electrically-conductive package body that may include a bottom surface on which the light emitting device may be mounted and a side surface that may reflect light emitted from the light emitting device, a first electrode that may protrude from the package body, and/or a second electrode coupled with the package body, wherein the first and second electrodes may be respectively coupled to second and first electrodes of other light emitting device packages, thereby forming an array of light emitting device packages.

The second electrode may have a first end portion that may include an electrode groove, in which the first electrode may be inserted, and/or a second end portion electrically connected to the light emitting device. The light emitting device package may include an insulation case for electrically insulating the package body. The insulation case may have a protrusion on its side, and either the insulation case or the package body may have an insertion groove in which the protrusion of the insulation case of another light emitting device package may be inserted, thereby forming an array of light emitting device package.

The insulation case may have a bottom cavity with a bottom and side surface in the package body, and the second electrode may have the second end portion at about the same or higher level than the bottom surface of the cavity.

An insulation layer may be between the second electrode and the package body. The second electrode may pass through the bottom or side surface of the cavity and through the package body.

The package body and/or the second electrode may be formed of OFHC (Oxygen Free High Conductivity) copper, Cu, a Cu alloy, a Cu—W alloy, Al, an Al alloy, a KOVAR alloy, and/or any other suitable material. The package body may be plated with Ni or another suitable material. The bottom or side surface of the cavity may be coated with a reflective layer, for example, Ag, Al, or the like.

Example embodiments of a light emitting device package may include: a light emitting device; an electrical insulator package body with a cavity in which the light emitting device is mounted and a side surface for reflecting light from the light emitting device; and/or first and second electrodes that may be electrically connected to the light emitting device and inserted in the package body. The first and second electrodes may be respectively coupled to second and first electrodes of other light emitting device packages to form an array of light emitting device packages.

The second electrode may have a first end portion including an electrode groove, in which the first electrode is inserted, and/or a second end portion electrically connected to the light emitting device. The package body may have a protrusion and an insertion groove that can be coupled to an insertion groove and protrusion of another light emitting device package. A heat sink may be on a bottom surface of the package body.

The first and second electrodes may be inserted in the package body at about the same level or higher than the bottom surface of the cavity. The second electrode may be exposed through the bottom or side surface of the cavity and pass through the package body.

The first and second electrodes may be formed of OFHC (Oxygen Free High Conductivity) copper, Cu, a Cu alloy, a Cu—W alloy, Al, an Al alloy, a KOVAR alloy, and/or any other suitable material. The bottom or side surface of the cavity may be coated with a reflective layer, for example, Ag, Al, or the like.

Example embodiments may include a plurality of light emitting device packages, each further including a light emitting device, an electrically-conductive package body with a cavity in which the light emitting device is mounted and a side surface for reflecting light emitted from the light emitting device, a first electrode protruding from the package body, and a second electrode inserted in the package body and having an electrode groove in which the first electrode of another light emitting device package is inserted, wherein the light emitting device packages may be arrayed by coupling the first and second electrodes to each other.

The light emitting device package array may further include an insulation case for electrically insulating the circumference of the package body, the insulation case including a protrusion at a side, wherein either the insulation case or the package body may have an insertion groove in which a protrusion of an insulation case of another light emitting device package may be inserted. An insulation layer may be interposed between the second electrode and the package body.

Example embodiments may provide a light emitting device package array including a plurality of light emitting device packages, each with a light emitting device, a electrically-insulated package body with a cavity having a bottom surface on which the light emitting device may be mounted and a side surface for reflecting light emitted from the light emitting device, and first and second electrodes may be electrically connected to the light emitting device and inserted in the package body, wherein the light emitting device packages may be arrayed by coupling the first and second electrodes to each other.

The package body may have a protrusion and an insertion groove that may be coupled to an insertion groove and a protrusion of other light emitting device package.

BRIEF DESCRIPTION OF THE DRAWINGS

The patent or application file contains at least one drawing executed in color. Copies of this patent or patent application publication with color drawing will be provided by the Office upon request and payment of the necessary fee.

The above and other features and/or advantages of example embodiments will become more apparent by describing them with reference to the attached drawings in which.

DETAILED DESCRIPTION

Figure 1:
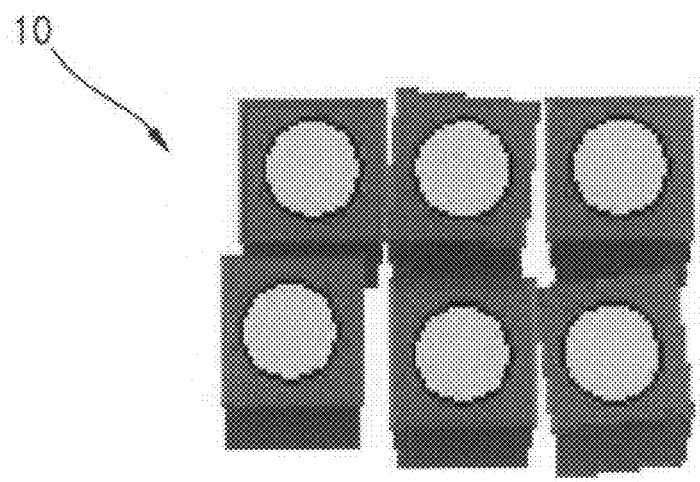
FIG. 1 illustrates a related art light emitting device package array with misaligned light emitting device packages.
Figure 2:
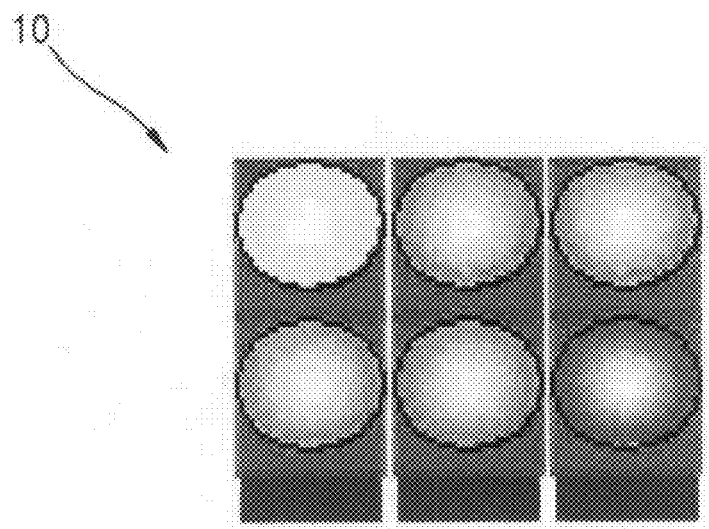
FIG. 2 illustrates a related art light emitting device package array where color uniformity of light emitting device packages is poor.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 3:
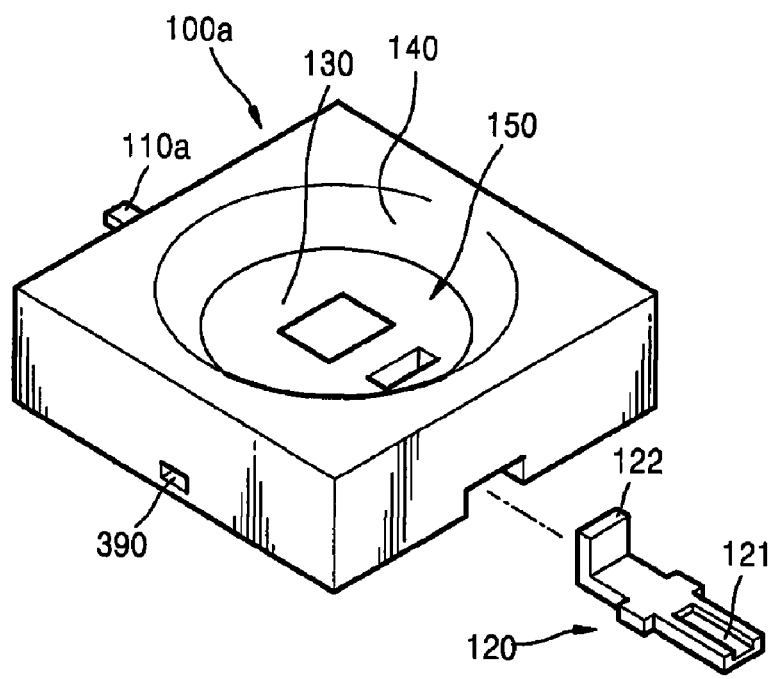
FIG. 3 is an exploded perspective view illustrating a light emitting device package according to an example embodiment.
Figure 4:
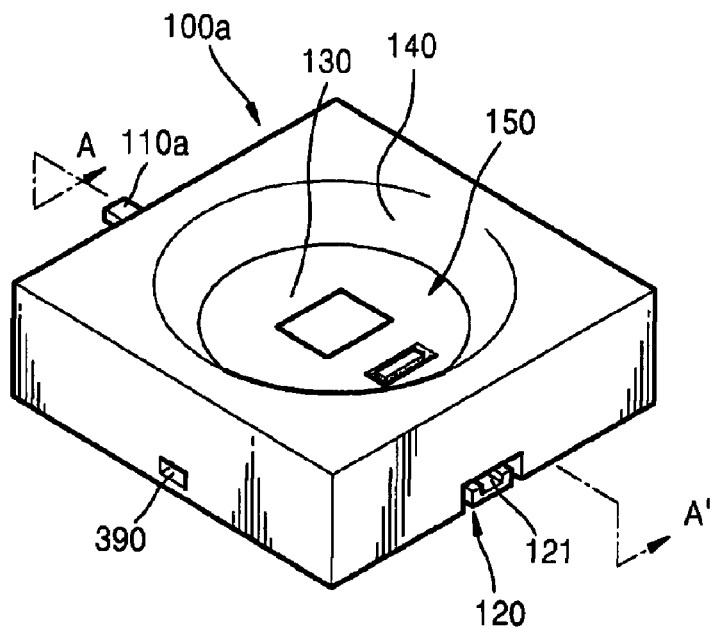
FIG. 4 is an assembled perspective view illustrating the example embodiment light emitting device package illustrated in FIG. 3.
Figure 5:
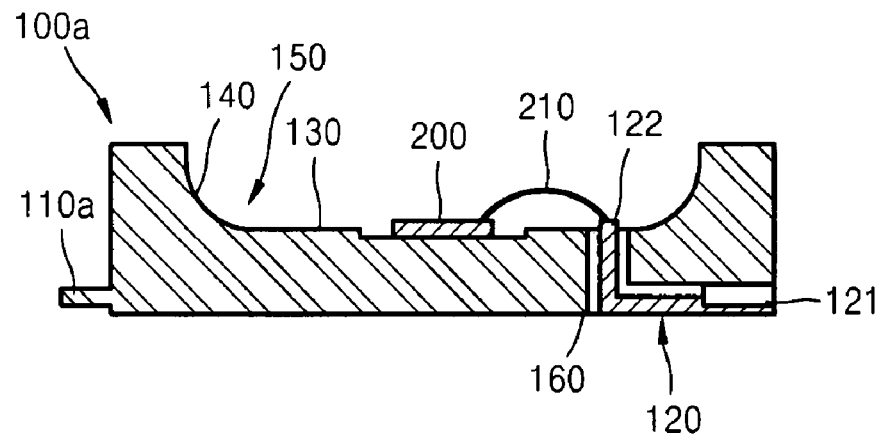
FIG. 5 is a sectional view taken along line A-A' of the example embodiment light emitting device package illustrated in FIG. 4.

FIG. 3 is an enlarged view illustrating a light emitting device package according to an example embodiment. FIG. 4 is an assembled perspective view illustrating the example embodiment light emitting device package illustrated in FIG. 3. FIG. 5 is a sectional view taken along line A-A' of the example embodiment light emitting device package illustrated in FIG. 4.

As shown in FIGS. 3 through 5, a light emitting device package may include a light emitting device 200, a package body 100a, a first electrode 110a, and/or a second electrode 120.

The light emitting device 200 may be a Light Emitting Diode (LED), a Laser Diode (LD), or the like. The light emitting device 200, which may be mounted through a flip chip bonding process or other suitable process, may be electrically connected to the first and second electrodes 110a and 120, for example, by wires 210 or any other connection. P-type and n-type electrode layers (not shown) may be formed on wire bonding surfaces of the light emitting device 200.

The light emitting device 200 may include the p-type electrode layer, an active layer, and/or the n-type electrode layer. If an electric voltage is applied between the p-type and n-type electrode layers of the light emitting device 200 across the first and second electrodes 110a and 120, electron holes of the p-type electrode layer may bond to electrons of the n-type electrode layer to generate light. Generated light may be emitted from the light emitting device 200. Wavelength and color of the generated light may depend on the material and/or structure of an active layer. The light emitting device 200 may be designed to provide a desired wavelength and color.

The package body 100a, on which the light emitting device 200 may be mounted, may be an integral body. The package body 100a may function as a heat sink to dissipate heat generated from the light emitting device 200 and/or as a packaging housing enclosing the light emitting device 200. The heat generated from the light emitting device 200 may be dissipated laterally through the package body 100a.

The package body 100a may be formed of a metal material, for example, copper (Cu), a Cu alloy, aluminum (Al), an Al alloy, or the like. The package body 100a may be formed of oxygen free high conductivity (OFHC) copper, Cu—W alloy, KOVAR alloy, and/or another suitable material. If the package body 100a is formed of a metallic material, color and/or luster of the package body 100a may change. A surface of the package body 100a may be plated with nickel (Ni) or the like to prevent or reduce color and/or luster changes A cavity 150 may be formed in a central portion of the package body 100a. The light emitting device 200 may be placed on an indented or flat bottom surface 130 in the cavity 150. A side surface 140 of the cavity 150 may reflect light emitted from the light emitting device 200. The side surface 140 of the cavity 150 may be concave and/or otherwise rounded so that the side surface 140 of the cavity 150 may reflect the light emitted from light emitting device 200 and may collect light within a desired angle range. Light emitted from the light emitting device 200 that travels toward the side surface 140 of the cavity 150 may be reflected from the side surface 140 in an angle range to improve light extraction within a viewing angle range. Improving light extraction may improve light emitting efficiency of the light emitting device package.

The curvature radius of the side surface 140 of the cavity 150 may vary depending on a desired viewing angle. A reflective layer may coat the bottom 130 and/or side surface 140 of the cavity 150. A lens (not shown) may be placed on the package body 100a around the cavity 150. Inside the cavity 150, a reflective layer (not shown), for example, a phosphor or other suitable material layer, may line the cavity 150 to emit light of a wavelength longer than that of light emitted from the light emitting device 200. A protective layer (not shown) may be formed on the light emitting device 200 to protect it. A heat dissipation layer (not shown) may be between the reflective and protective layer to dissipate heat generated from the reflective layer and/or the light emitting device 200.

The package body 100a may be formed of an electrically conductive material. The first electrode 110a may be integrally formed with the package body 100a. The first electrode 110a may be formed of the same material as the package body 100a. The first electrode 110a may be formed of OFHC copper, Cu, a Cu alloy, a Cu—W alloy, Al, an Al alloy, a KOVAR alloy, and/or another suitable material. Electric power may be applied to the light emitting device 200 through the first electrode 110a and the bottom surface 130.

The second electrode 120 may be prepared as a separate component from the package body 100a and inserted into the package body 100a. An electrode groove 121, in which the first electrode 110a may be inserted, may be formed on a first end portion of the second electrode 120. If the first electrode 110a is inserted in the electrode groove 121 of the second electrode 120, a light emitting device package array having a desired size may be formed. In a light emitting device package having two adjacent light emitting devices 200, the first electrode 110a of a rear light emitting device 200 may be coupled to the second electrode 120 of a front light emitting device 200. The light emitting devices 200 may be linearly connected to each other.

The second electrode 120 may have a second end portion 122 exposed through the bottom of the cavity 150 and/or side surface 140 and pass through the package body 100a. The second end portion 122 of the second electrode 120 may be positioned at about the same level or higher than the bottom surface 130. The second end portion 122 of the second electrode 120 may be electrically connected to the light emitting device 200 by the wires 210 bonded on the light emitting device 200. Electric power may be supplied to the light emitting device 200 through the second electrode 120. The second electrode 120 may be formed of an electrically-conductive material or combination of such materials such as OFHC copper, Cu, a Cu alloy, a Cu—W alloy, Al, an Al alloy, a KOVAR alloy, and/or the like.

A conductive plate (not shown) may be between the light emitting device 200 and the cavity bottom 130. The conductive plate may function to dissipate heat and/or also it may connect the light emitting device 200 to the first and second electrodes 110 and 120. A pad (not shown), on which the wires 210 may be bonded and a metal line (not shown) may electrically interconnect p-type and n-type electrode layers of the light emitting device 200, may be on the conductive plate. FIG. 5 illustrates that the wires 210 may be directly connected to the light emitting device 200; however, a power connecting member such as the conductive plate may be provided.

If the package body 100a is formed of a conductive material, the package body 100a may need to be electrically insulated from the second electrode 120. To achieve this, an insulation layer 160 may be formed of an insulating material, such as ceramic, glass, or the like, between the second electrode 120 and the package body 100a. If the package body 100a is formed of a metal material, heat dissipation efficiency may be enhanced. The package body 100a may be insulated from the second electrode 120 and from another adjacent package body.

Figure 6:
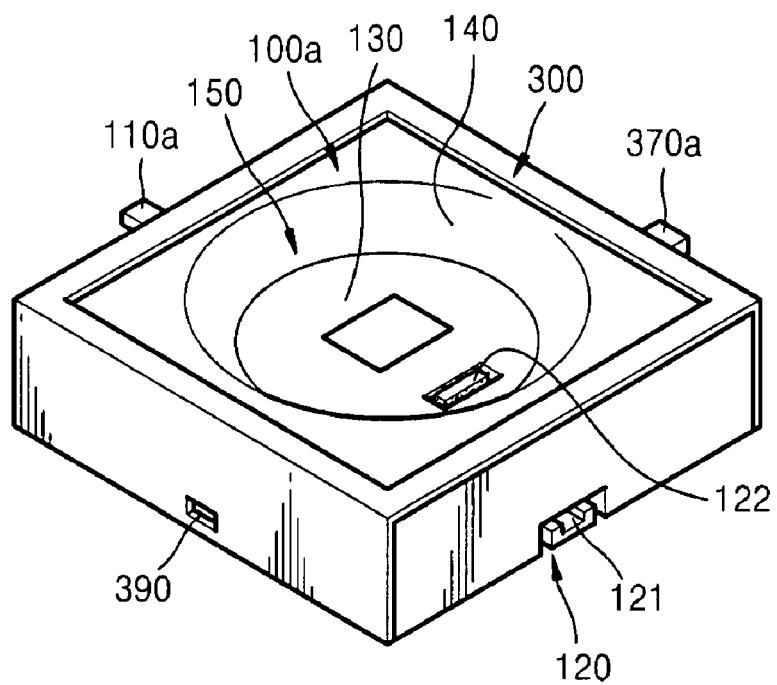
FIG. 6 is a perspective view illustrating the example embodiment light emitting device package illustrated in FIG. 4 to which an insulation case is added.
Figure 7:
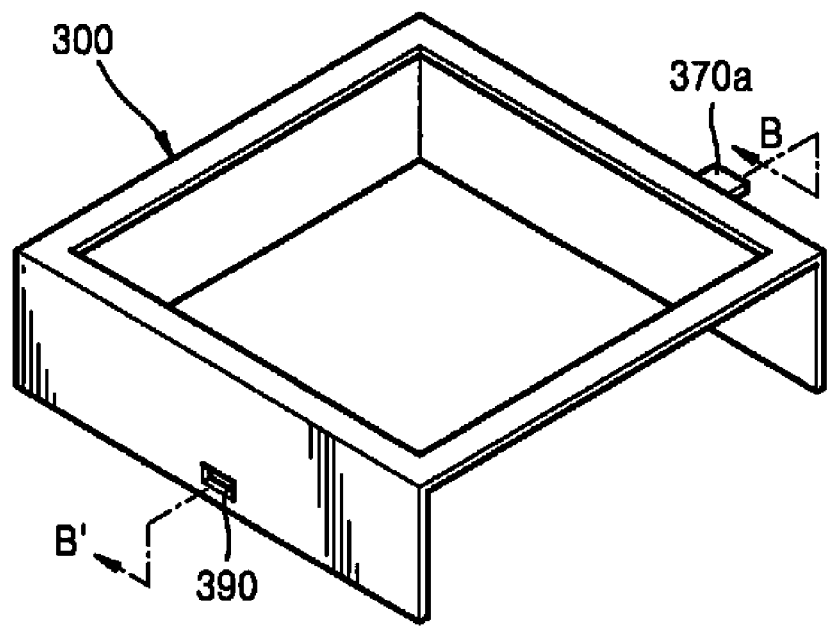
FIG. 7 is a perspective view illustrating an insulation case according to example embodiments.

FIG. 6 shows the example embodiment light emitting device package illustrated in FIG. 4, to which an insulation case may be added. FIG. 7 illustrates an insulation case according to an example embodiment, and FIG. 8 is a sectional view taken along line B-B' of the example embodiment insulation case illustrated in FIG. 7.

Figure 8:
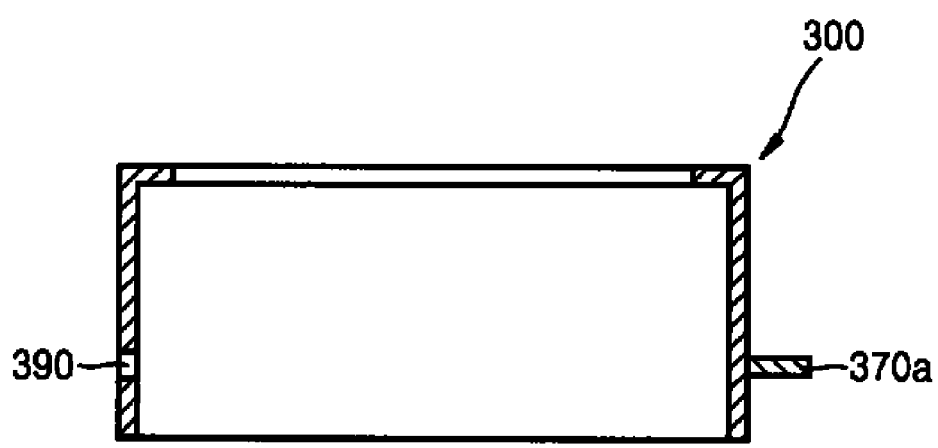
FIG. 8 is a sectional view taken along line B-B' of the example embodiment insulation case illustrated in FIG. 7.

FIGS. 6 through 8 show an example embodiment insulation case 300 for enclosing the package body 100a for electrical insulation. The insulation case 300 may insulate two adjacent package bodies. A protrusion 370a may be formed on a side of the insulation case 300. An insertion groove 390 may be formed on one side of the insulation case 300 and the package body 100a. A light emitting device package array having a plurality of light emitting device packages may be formed by inserting the protrusion 370a into the insertion groove 390.

The insulation case 300 may be formed of an insulating material, for example, a synthetic resin or another suitable material. Such materials may have relatively low heat conductivity, and the insulation case 300 may have an opened bottom surface to dissipate heat from the package body 100a. The insulation case 300 may be have an opened top surface to enhance heat dissipation efficiency and/or provide space in which a lens may be placed and through which light emitted from the light emitting device 200 may pass.

Figure 9:
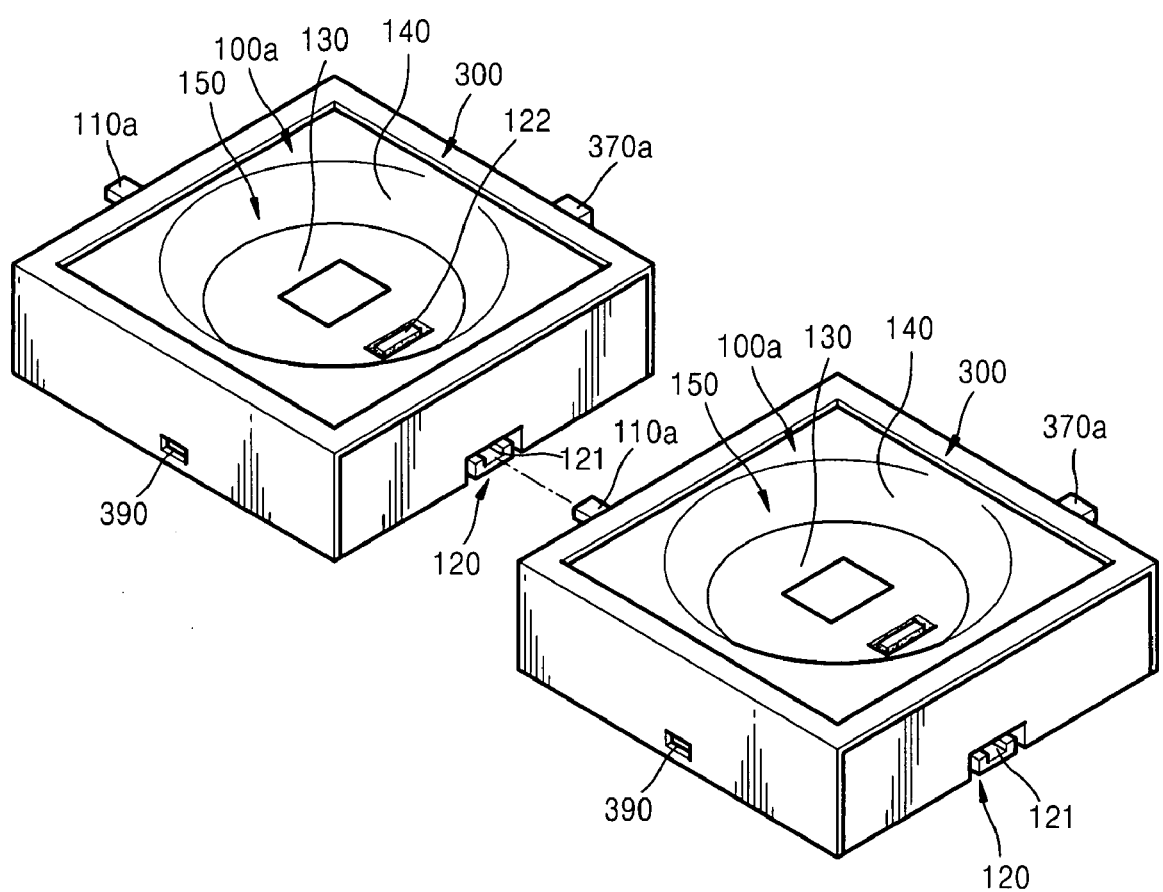
FIG. 9 is a perspective view illustrating an example method of coupling light emitting device packages to each other.

FIG. 9 shows an example method of coupling light emitting device packages to each other. The first electrode 110a of a first light emitting device package may be inserted in the electrode groove 121 of the second electrode 120 so that the first and a second light emitting device packages may be electrically connected. Because the package bodies 100a or the insulation cases 300 may be in contact with each other, movement of light emitting device packages may be prevented, improving alignment of light emitting device packages.

Figure 10:
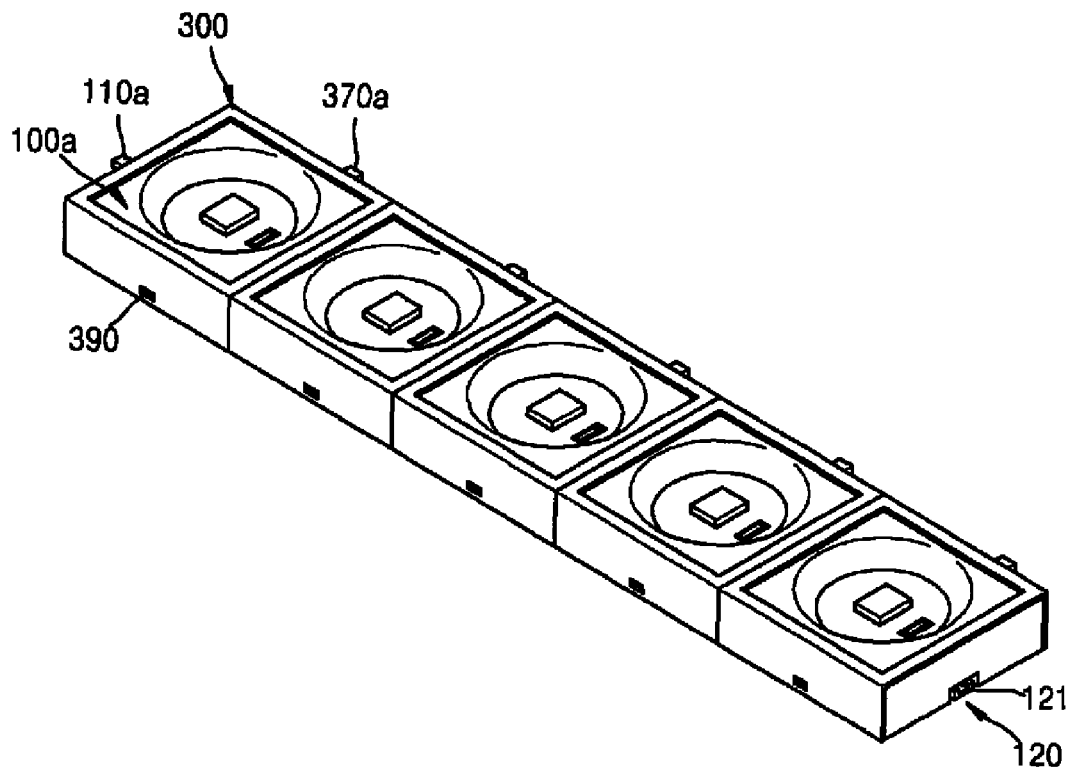
FIG. 10 is a perspective view illustrating a light emitting device package array according to example embodiments.

FIG. 10 is a perspective view illustrating a light emitting device package array according to an example embodiment.

If the first and second electrodes 110a and 120 are coupled to each other, the light emitting device packages may be accurately aligned and electrically connected to each other.

Figure 11:
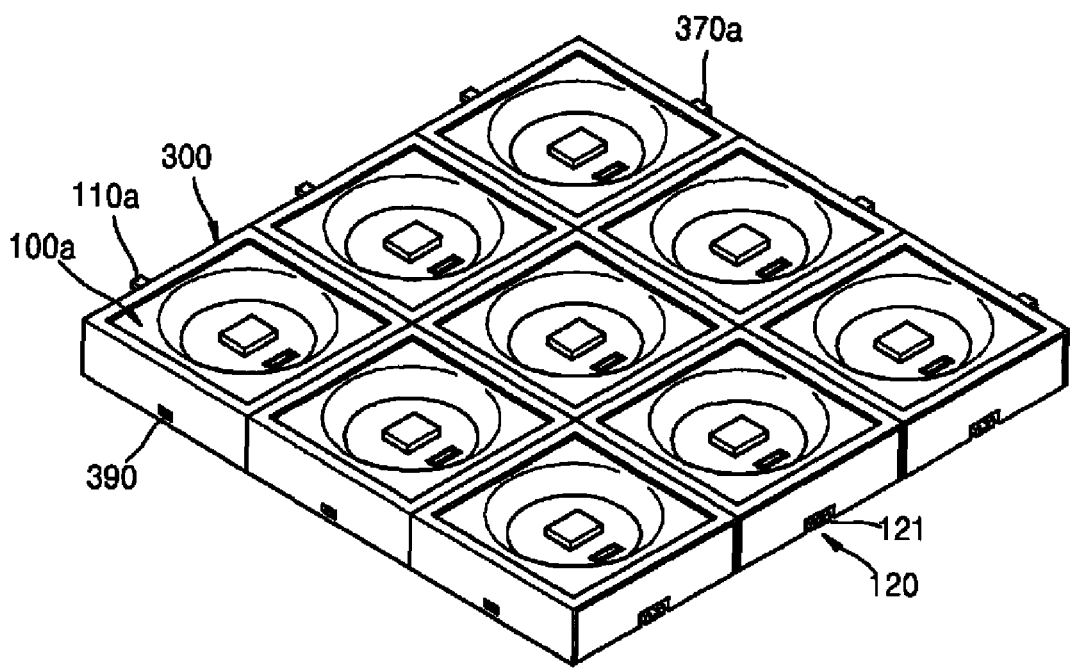
FIG. 11 is a perspective view of a light emitting device package array according to example embodiments.

FIG. 11 shows a light emitting device package array according to an example embodiment. The light emitting device packages may be arranged in columns and rows. If the first and second electrodes 110a and 120 are coupled and the protrusion 370a is inserted into the insertion groove 390, the light emitting device packages may be electrically connected and accurately aligned.

Figure 12:
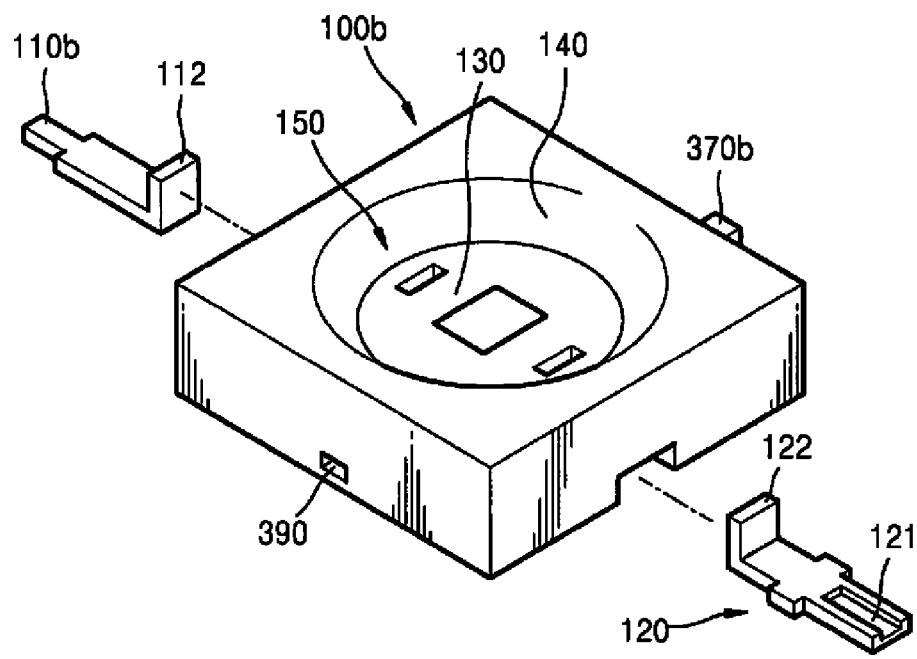
FIG. 12 is an exploded perspective view illustrating a light emitting device package according to example embodiments.
Figure 13:
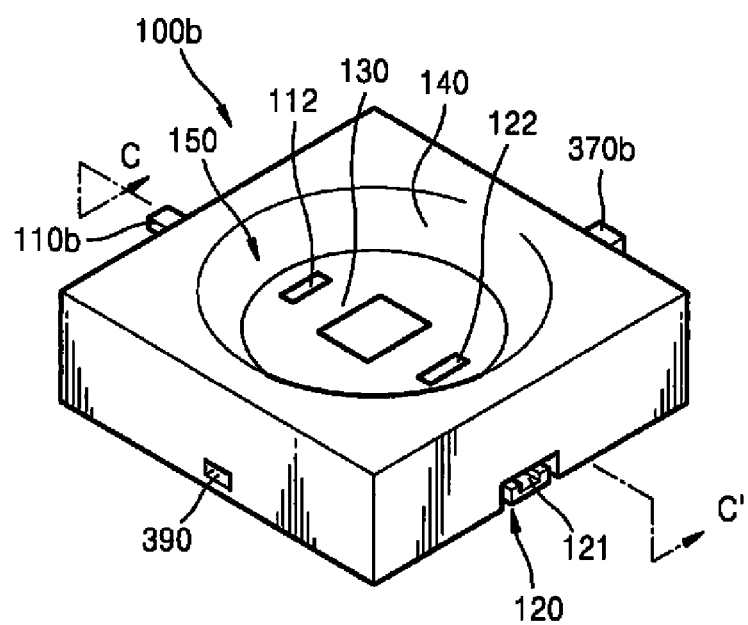
FIG. 13 is an assembled perspective view illustrating the example embodiment light emitting device package illustrated in FIG. 12.
Figure 14:
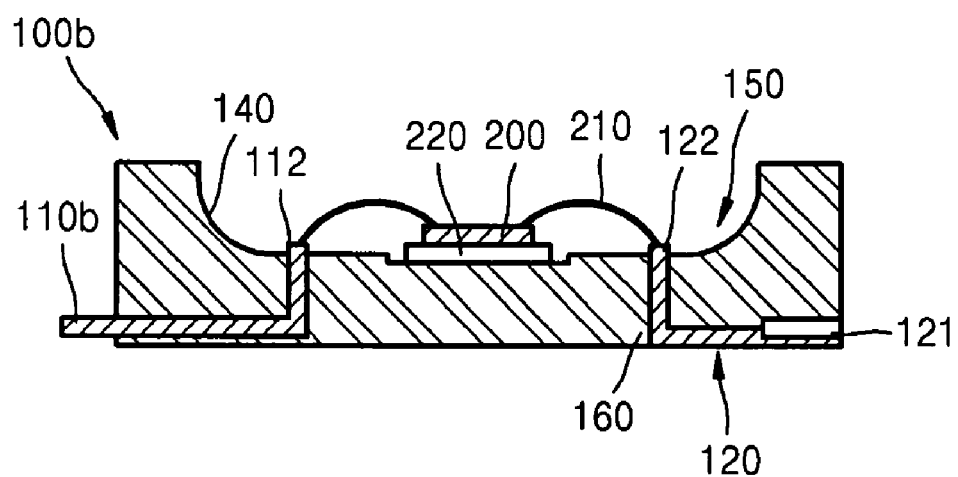
FIG. 14 is a sectional view taken along line C-C' of the example embodiment light emitting device package illustrated in FIG. 13.

FIG. 12 is an enlarged perspective view illustrating a light emitting device package according to an example embodiment. FIG. 13 is an assembled perspective view of the example embodiment light emitting device package illustrated in FIG. 12. FIG. 14 is a sectional view taken along line C-C' of the example embodiment light emitting device package illustrated in FIG. 13. A package body 100b of the example embodiment is formed of an insulation material such as synthetic resin or silicon. The same parts as those of the foregoing example embodiment will not be described in the following description.

First and second electrodes 110b and 120 may be formed of an electrically conductive material apart from the package body 100b. If the first and second electrodes 110b and 120 are coupled, a plurality of light emitting device packages may be arranged in a line. The package body 100b may have a protrusion 370b and an insertion groove 390 on its sides. If the first and second electrodes 110b and 120 are coupled and the protrusion 270b is inserted into the insertion groove 390, the plurality of light emitting device packages may be arranged in rows and columns and may be electrically connected to each other while being accurately aligned.

The first and second electrodes 110b and 120 may be exposed through the bottom surface 130 and the side surface 140 of the cavity 150 and may pass through the package body 100b. Parts of the first and second electrodes 110b and 120 may be inserted into the package body 100b, and part 112 and the second end portion 122 may be positioned at about the same or higher than the bottom surface 130 and may connect to the light emitting device 200 by the wires 210, which may transmit electrical power to a light emitting device package. The first and second electrodes 110b and 120 may be formed of a conductive material or combination of conductive materials such as OFHC copper, Cu, a Cu alloy, a Cu—W alloy, Al, an Al alloy, a KOVAR alloy, and the like.

If the package body 100b is formed of the insulation material, the package body 100b may not need to be insulated from the first and second electrodes 110b and 120 or another adjacent package body. If the package body 100b is formed of insulating material, the heat conductivity of the package body 100b may be decreased. A heat sink 220 may be on the bottom surface of the package body 100b to dissipate heat from the light emitting device 200.

If there are no additional connecting members for connecting the light emitting device packages and/or any additional printed circuit board for mounting and/or supporting the light emitting device package array, the light emitting device packages may be arrayed by inserting the first electrode 110a or 110b into the second electrode 120 during the second level packaging process of forming the light emitting device package array.

Because the package body 100a or 100b or the insulation case 300 may function as a stopper and/or a guide during a process of assembling the light emitting device packages, movement of the light emitting device packages may be reduced or prevented, and/or alignment of the light emitting device packages may be improved.

In the related art, the light emitting device package array may be formed as an integral unit. In example embodiments, because the light emitting device package may be formed as a module type, the desired number of light emitting device packages may be assembled in a desired shape and, if required, may be disassembled from each other. If color and intensity of light differs from a desired level at a location of the light emitting device package array, the light emitting device package(s) corresponding to that location of the light emitting device package array may be replaced with a new light emitting device package, thus improving the uniformity of color and/or intensity of light.

Example embodiments of the above-described light emitting device packages and the light emitting device package array may simplify the second packaging process of forming the light emitting device package array. Movement of the light emitting device packages may be reduced or prevented, and the alignment of the light emitting device packages may be improved. In addition, processing costs may be reduced, and the uniformity of color and/or intensity of light may be improved.

What is claimed is:

1. A light emitting package comprising:
   a light emitting device;
   a package body including a cavity in which the light emitting device is mounted, wherein the cavity includes at least one side and bottom surface;
   a first electrode including a protrusion protruding outwardly from one side of the package body, the protrusion is formed integrally with the package body; and
   a second electrode coupled with the package body, the second electrode including a first end portion exposed through the other side of the package body and a second end portion exposed through the bottom or side surface of the cavity and electrically connected to the light emitting device,
   wherein the first electrode is coupled to a second electrode of another light emitting package by inserting the protrusion of the first electrode into the electrode groove of the second electrode of another light emitting package, thereby forming an array of light emitting device packages.

2. The light emitting package of claim 1, wherein the side surface of the cavity is configured to reflect light emitted from the light emitting device.

3. The light emitting package of claim 1, wherein the package body is formed of an electrically-conductive material.

4. The light emitting package of claim 1, wherein the electrode groove of the second electrode is configured to mate with another protrusion shaped like the protrusion of the first electrode of another light emitting package.

5. The light emitting package of claim 1, further comprising an insulation case around the package body.

6. The light emitting package of claim 5, wherein the insulation case includes a protrusion on a side of the insulation case and at least one of the insulation case and the package body includes an insertion groove configured to allow the protrusion of the insulation case of another light emitting package to be inserted into the insertion groove.

7. The light emitting package of claim 5, wherein the insulation case has an open bottom surface to expose the bottom surface of the package body.

8. The light emitting package of claim 1, wherein the second electrode of the light emitting package has the second end portion at about the same or higher level than the bottom surface of the cavity.

9. The light emitting package of claim 1, further comprising:
   an insulation layer between the second electrode of the light emitting package and the package body.

10. The light emitting package of claim 1, wherein the second electrode of the light emitting package is exposed to the cavity and passes through the package body.

11. The light emitting package of claim 1, wherein the package body and the second electrode of the light emitting package are formed of an electrically-conductive material.

12. The light emitting package of claim 1, wherein the package body and the second electrode of the light emitting package are formed of one or more of Oxygen-Free High Conductivity copper, copper (Cu), a copper alloy, a copper-tungsten (Cu—W) alloy, aluminum (Al), an aluminum alloy, and a nickel-cobalt ferrous alloy.

13. The light emitting package of claim 1, wherein the package body is plated with a material having constant luster and color.

14. The light emitting package of claim 13, wherein the plating material is nickel (Ni).

15. The light emitting package of claim 1, wherein the bottom or side surface of the cavity is coated with a reflective layer formed of a reflective material.

16. The light emitting package of claim 15, wherein the reflective material is silver (Ag) or aluminum (Al).

17. The light emitting package of claim 1, further comprising:
   a reflective layer lining the cavity configured to emit light of a wavelength longer than that of light emitted from the light emitting device;
   a protective layer on the light emitting device; and
   a heat dissipation layer between the reflective and protective layer.

* * * * *